United States Patent
Ohfuji et al.

(10) Patent No.: US 10,167,569 B2
(45) Date of Patent: Jan. 1, 2019

(54) HEXAGONAL DIAMOND BULK SINTERED BODY AND ITS MANUFACTURING METHOD

(71) Applicant: NATIONAL UNIVERSITY CORPORATION EHIME UNIVERSITY, Matsuyama-shi, Ehime (JP)

(72) Inventors: Hiroaki Ohfuji, Matsuyama (JP); Tetsuo Irifune, Matsuyama (JP)

(73) Assignee: NATIONAL UNIVERSITY CORPORATION EHIME UNIVERSITY, Matsuyama (JP)

( * ) Notice: Subject to any disclaimer, the term of this patent is extended or adjusted under 35 U.S.C. 154(b) by 752 days.

(21) Appl. No.: 14/421,690

(22) PCT Filed: Feb. 6, 2013

(86) PCT No.: PCT/JP2013/052768
§ 371 (c)(1),
(2) Date: Jun. 24, 2015

(87) PCT Pub. No.: WO2014/027470
PCT Pub. Date: Feb. 20, 2014

(65) Prior Publication Data
US 2015/0292107 A1 Oct. 15, 2015

(30) Foreign Application Priority Data
Aug. 16, 2012 (JP) .................................. 2012-180427

(51) Int. Cl.
*C30B 1/12* (2006.01)
*C04B 35/52* (2006.01)
(Continued)

(52) U.S. Cl.
CPC .................. *C30B 1/12* (2013.01); *B01J 3/067* (2013.01); *C04B 35/52* (2013.01); *C04B 35/645* (2013.01);
(Continued)

(58) Field of Classification Search
None
See application file for complete search history.

(56) References Cited

U.S. PATENT DOCUMENTS 5,690,794 A * 11/1997 Molchanov .............. B01J 3/062
204/157.15
7,687,146 B1 * 3/2010 Freitas, Jr. .............. C01B 32/25
423/447.1
2015/0027363 A1 * 1/2015 Borse ...................... C30L 39/00
117/79

FOREIGN PATENT DOCUMENTS

CN 10-2712478 A 10/2012
JP H04-083525 A 3/1992
(Continued)

OTHER PUBLICATIONS

Hirose et al.; Femtosecond Laser-Driven Shock Synthesis of Hexagonal Diamond From Highly Oriented Pyrolytic Graphite; Journal of Physics: Conference Series; 165, 1-4; 2008.*
(Continued)

*Primary Examiner* — Guinever S Gregorio
(74) *Attorney, Agent, or Firm* — Oliff PLC

(57) ABSTRACT

A method capable of obtaining pure single phase hexagonal diamond in an industrially usable size (bulk) is provided. Highly oriented and highly crystallized graphite having a mosaic spread of 5° or less is used as a starting material, and is subjected to a temperature ranging from 1000 to 1500° C. at a pressure ranging from 20 to 25 GPa. The size of the bulk sintered body of pure single-phase hexagonal diamond obtained by this method depends on the size of the starting (Continued)

graphite. However, as long as the pressure and temperature can be entirely provided (i.e., as long as the adequate high pressure and temperature are applied to the sample chamber of high pressure apparatus), any desired size can be obtained.

8 Claims, 7 Drawing Sheets

(51) Int. Cl.
    *C04B 35/645*    (2006.01)
    *B01J 3/06*    (2006.01)
    *C30B 29/02*    (2006.01)
    *C30B 29/04*    (2006.01)

(52) U.S. Cl.
    CPC .............. *C30B 29/02* (2013.01); *C30B 29/04* (2013.01); *B01J 2203/061* (2013.01); *C04B 2235/425* (2013.01); *C04B 2235/5292* (2013.01); *C04B 2235/81* (2013.01); *C04B 2235/95* (2013.01)

(56) References Cited

FOREIGN PATENT DOCUMENTS

| | | |
|---|---|---|
| JP | 2003-117379 A | 4/2003 |
| JP | 2003-292397 A | 10/2003 |
| JP | 03-837486 B2 | 10/2006 |
| JP | 04-075771 B2 | 4/2008 |
| JP | 04-275896 B2 | 6/2009 |
| KR | 2012-0088882 A | 8/2012 |
| WO | 2012/023473 A1 | 2/2012 |

OTHER PUBLICATIONS

Irifune et al.; Nanolayered Diamond Sintered Compact Obtained by Direct Conversion from Highly Oriented Graphite under High Pressure and High Temperature; Journal of Nanomaterials; 2013.*
Pan, Zicheng, et al., "Harder than Diamond: Superior Indentation Strength of Wurtzite BN and Lonsdaleite," Phys. Rev. Lett. 102, pp. 055503-1 to 055503-4 (2009).
Qingkun, Li, et al., "Lonsdaleite—a material stronger and stiffer than diamond," Scripta Materials, 65, 229-232 (2011).
Yoshiasa, Akira, et al., "Detailed structure of hexagonal diamond (Lonsdaleite) and wurtzite-type BN," Jpn. J. Appl. Phys. 42, 1694-1704 (2003).
Atomgraph AG (Russia), "Highly Oriented Pyrolytic Graphite," [searched online Jul. 28, 2012], 2 pages.
Griggs, Jessica, "Diamond no longer nature's hardest material," New Scientist, Tech, Feb. 16, 2009, www.newscientist.com/article/dn156610-diamond-no-longer-natures-hardest-material, 4 pages.
Ohfuji, Hiroaki, et al., "Origin of unique microstructures in nano-polycrystalline diamond synthesized by direct conversion of graphite at static high pressure," J. Mineralogical and Petrological Sciences, vol. 104, pp. 307-312 (2009).
Motoki, Kensuke, "High pressure synthesis of a bulk sintered body of single-phase hexagonal diamond," presentation paper from meeting held on Feb. 18, 2012 at National University Corporation, Ehime University.
Feb. 17, 2015 International Preliminary Report in PCT/JP2013/052768.
Feb. 13, 2015 International Search Report issued in PCT/JP2013/052768.

* cited by examiner

[001] PROJECTION

[011] PROJECTION

[021] PROJECTION

[031] PROJECTION

[010] PROJECTION

Fig. 9

| PHYSICAL PROPERTIES | | MEASURED VALUE | THEORETICAL VALUE (NON-PATENT LITERATURE 3) |
|---|---|---|---|
| LATTICE CONSTANT | $a$ (Å) | 2.4975(15) | 2.4834 |
| | $c$ (Å) | 4.1781(36) | 4.1354 |
| VOLUME (Å$^3$) | | 22.57(2) | 22.09 |
| DENSITY (g/cm$^3$) | XRD | 3.53(0) | 3.61 |
| | ARCHIMEDES | 3.57(6) | |

HEXAGONAL DIAMOND BULK SINTERED BODY AND ITS MANUFACTURING METHOD

TECHNICAL FIELD

The present invention relates to a hexagonal diamond bulk sintered body and its manufacturing method.

BACKGROUND ART

Among methods of fabricating polycrystalline diamond by the direct conversion from graphite, a method described in Patent Literature 1 has been known. This method can fabricate polycrystalline cubic diamond directly from graphite at an ultrahigh pressure and high temperature without adding a sintering aid and/or a catalyser. The polycrystalline diamond has an average crystalline size of 100 nm or less, a purity of at least 99% and a hardness of at least 110 GPa; these are properties that make the polycrystalline diamond industrially usable for a tool tip or the like.

In general, materials referred to as diamond, which include a material described in Patent Literature 1, have a cubic crystal structure. On the other hand, it has been known that there is also a hexagonal polymorph called hexagonal diamond or lonsdaleite, natural mineral name. Hexagonal diamond is composed only of sp3-bonded carbon, as with cubic diamond, and has the same density, but is thermodynamically metastable. However, a recent theoretical calculation suggests that hexagonal diamond has an indentation hardness higher by 58% than cubic diamond (Non Patent Literature 1). It has also been predicted that hexagonal diamond has higher Young's moduli than cubic diamond in most crystallographic orientations (i.e., resistant to deformation) (Non Patent Literature 2). Accordingly, hexagonal diamond has a promising potential as an industrial material, such as for ultrahard tools.

CITATION LIST

Patent Literature

[Patent Literature 1] JP 4275896 B
[Patent Literature 2] JP 04-075771 B
[Patent Literature 3] JP 3837486 B

Non Patent Literature

[Non Patent Literature 1] Zicheng Pan et al., "Harder than Diamond: Superior Indentation Strength of Wurtzite BN and Lonsdaleite", Phys. Rev. Lett. 102, 055503 (2009)
[Non Patent Literature 2] Li Qingkun et al., "Lonsdaleite—A material stronger and stiffer than diamond", Scripta Materialia, 65, 229-232 (2011)
[Non Patent Literature 3] Akira Yoshiasa et al., "Detailed structures of hexagonal diamond (lonsdaleite) and wurtzite-type BN", Jpn. J. Appl. Phys. 42, 1694-1704 (2003)

SUMMARY OF INVENTION

Technical Problem

Conventionally, various methods of fabricating hexagonal diamond have been disclosed. Patent Literature 2 discloses a shock wave pressurization method where a compact with a porosity of less than 50% composed of a mixture of graphite powder and copper powder (80-98 wt %) is shock-compressed at a projectile velocity of 500 to 2000 msec. Patent Literature 3 discloses a method of obtaining hexagonal diamond powder by colliding a high velocity object with cubic diamond powder at an impact pressure of at least 30 GPa generated by uniaxial shock waves. According to this method, the phase transition from cubic diamond to hexagonal diamond by layer shift is promoted by applying a shearing stress to cubic diamond powder.

Although each of these methods can partially provide high-purity hexagonal diamond, the product is in the form of powder and contains unreacted graphite and cubic diamond in a mixed manner. This means that a pure bulk sample of (single-phase) hexagonal diamond that can be used for industrial applications has not ever been obtained yet.

The present invention provides a method to obtain a bulk sintered body of pure (single-phase) hexagonal diamond that can be used for industrial applications.

Solution to Problem

The present manufacturing method of a bulk sintered body of pure (single-phase) hexagonal diamond, which will be simply referred to as "pure hexagonal diamond compact" in the following description, is characterized by the direct conversion from highly oriented and highly crystallized graphite to pure hexagonal diamond at a temperature ranging from 1000 to 1500° C. and at a pressure of 21 GPa or higher.

Desirable starting material for the present manufacturing method is highly oriented and highly crystallized graphite with a mosaic spread, which is an index of the degree of lattice preferred orientation, of 5° or less.

The use of starting material with a mosaic spread of 1° or less is preferable to obtain single-phase hexagonal diamond at the pressure and temperature ranges given above. In the case where the mosaic spread of starting material is somewhat higher than this level, equivalent hexagonal diamond product can be obtained by applying a pressure of at least 22 GPa and a high temperature ranging from 1200 to 1400° C. From a theoretical point of view, there is no upper limit to the pressure required to obtain pure hexagonal diamond. However, as described later, pure hexagonal diamond can currently be obtained at 25 GPa, which is the maximum pressure available using a conventional multi-anvil high pressure apparatus.

The heating duration of the sample at a desirable pressure is at least 1 min to obtain pure hexagonal diamond. Heating for shorter times than this results in the residue of unreacted starting material. In order to improve the degree of sintering of hexagonal diamond compact, heating for at least 10 min is recommended. Although there is no particular upper limit on heating duration, heating for 60 min or less is adequate considering the manufacturing efficiency.

This method can provide a pure hexagonal diamond compact in which no impurities, neither unreacted graphite residues nor cubic diamond are detected at all by bulk X-ray diffraction and electron beam diffraction analysis under TEM. The size of hexagonal diamond compact obtained by this method depends simply on the size of highly oriented and highly crystallized graphite used as the starting material. This means that pure hexagonal diamond compact with any desired size can be obtained as long as the required pressure and temperature conditions are given to the sample chamber of a high pressure apparatus.

Advantageous Effects of Invention

Hexagonal diamond is thermodynamically metastable. The conventional methods can provide hexagonal diamond only as a mixture with unreacted starting material (graphite) and thermodynamically stable cubic diamond (Patent Literature 3 and Non Patent Literature 3). The present invention provides a millimetre-sized pure hexagonal diamond compact by high pressure and high temperature using graphite with significantly high crystallinity and ordering (preferred orientation) as the starting material at pressures higher than those of the conventional technique (at least 21 GPa; preferably more than 22 GPa).

The obtained pure hexagonal diamond compact has a density equivalent to the theoretical value, suggesting that it contains virtually no pores (voids). It consists of lamellar crystals with a thickness ranging from several to several tens of nanometers. The nanoscale lamellar textures formed by the alternating stacking of layered crystals in which the (100) plane of hexagonal diamond is exclusively oriented in the stacking direction, while no particular preferred orientations are found in the orthogonal direction. As shown later in a high-resolution TEM image, each layer is strongly bonded to each other in an atomic level. The anisotropy of hardness is expected to be reduced due to such a complex, alternating stacking of nano-layered crystals. Therefore, it is also expected that the present hexagonal diamond compact possesses superior hardness and toughness than single crystal hexagonal diamond as with the case of nano-polycrystalline diamond (Patent Literature 1).

As long as adequate pressure and temperature conditions are provided to the sample chamber, a pure hexagonal diamond compact can be obtained in any desired size. Currently available pure hexagonal diamond compact obtained by the present method is 1 to 2 mm size, which is large enough to use as a superhard tool tip can be manufactured. With the use of the pure hexagonal diamond compact obtained by the present invention direct measurements of the physical properties such as hardness, elasticity, thermal conductivity, etc. of hexagonal diamond may be achieved, which could open up new fields of industrial application of this material.

BRIEF DESCRIPTION OF DRAWINGS

FIG. 9 shows a table of comparison between measured and theoretical values of the lattice constants, volumes and densities of the hexagonal diamond fabricated in the embodiment.

DESCRIPTION OF EMBODIMENTS

Hereinafter, first, an embodiment of a manufacturing method of a pure hexagonal diamond compact based on the present invention is described. Then, an embodiment of characterizing the pure hexagonal diamond compact manufactured by the present invention is described.

Figure 1A:
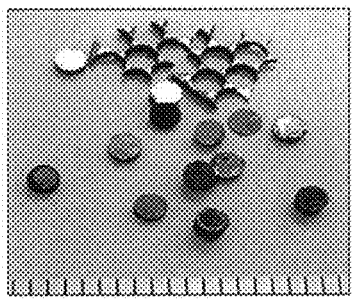
FIG. 1A shows a photograph of highly oriented and highly crystallized graphite starting material used in an embodiment of the present invention.
Figure 1B:
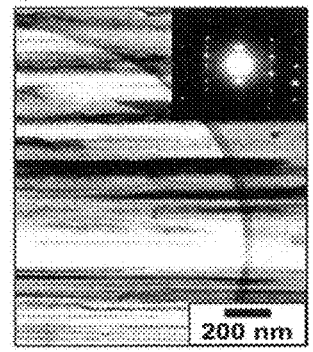
FIG. 1B shows a TEM image and a corresponding electron diffraction pattern (upper right inset) of a cross-section of the highly oriented and highly crystallized graphite.

Embodiments (1) Embodiment of the Present Manufacturing Method of Pure Hexagonal Diamond Compact First, a highly oriented and highly crystallized graphite sheet of 1.5 mm thick is cut into a disk shape with a diameter of 2 mm using a near-infrared laser beam (FIG. 1A). In this embodiment, a highly oriented pyrolytic graphite (HOPG) sheet made by NT-MDT (Russia) (grade of GRAS (ZYA)) was used as the starting material. The HOPG sheet used is characterized by a mosaic spread of 0.4±0.1° and a density ranging from 2.255 to 2.265 g/cm$^3$. A TEM image and an electron diffraction pattern of a cross-section of the HOPG are shown in FIG. 1B.

Figure 2A:
FIG. 2A is a photograph of a multi-anvil high pressure apparatus used for manufacturing a pure hexagonal diamond compact in the embodiment.
Figure 2B:
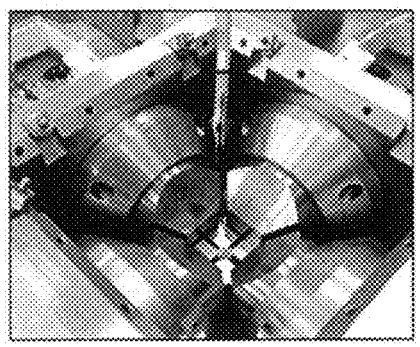
FIG. 2B is a photograph of the first stage anvils of the high pressure apparatus.
Figure 2C:
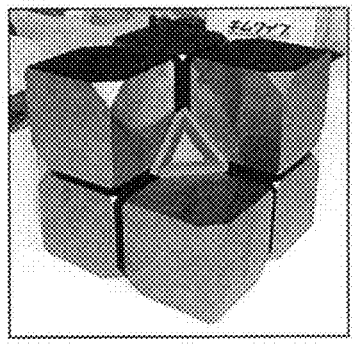
FIG. 2C is a photograph of the second stage anvils.
Figure 2D:
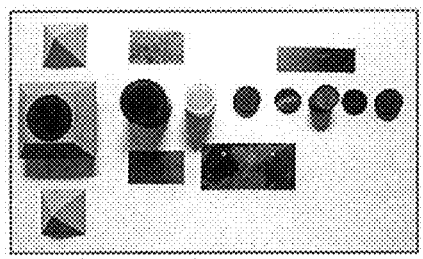
FIG. 2D is a photograph of parts assembly of a high pressure cell.
Figure 3:
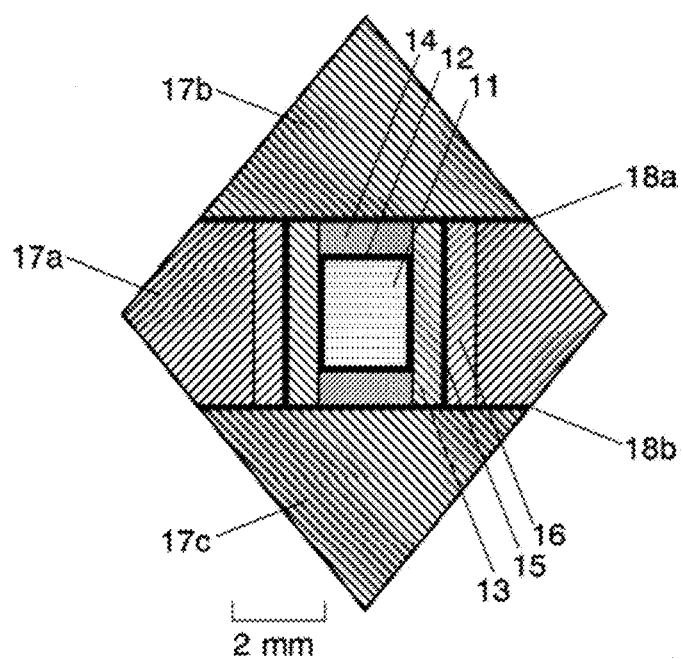
FIG. 3 shows a schematic illustration of the high pressure cell for the high pressure apparatus.

A highly oriented and highly crystallized graphite laser-cut into a disk shape was compressed to a high pressure ranging from 20 to 25 GPa and then heated to a target temperature ranging from 800 to 2000° C. in a high pressure apparatus shown in FIG. 2A. The high pressure apparatus used here is a multi-anvil type in which pressure is applied to the sample by compressing a high pressure cell by a set of second-stage anvils (eight cubes), as shown in FIGS. 2B and 2C. A high pressure cell composed of parts assembly shown in FIGS. 2D and 3 is placed at the centre of the eight second-stage anvils (FIG. 2C), which are compressed by first-stage anvils from six diagonal directions. This compression system preferable to generate a hydrostatic isotropic pressure in the sample chamber.

The detail of the high-pressure cell assembly used in the present embodiment is described as follows. Referring to FIG. 3, a mechanism of applying the pressure and temperature is described. The highly oriented and highly crystallized graphite starting material 11 was, first, inserted into a capsule 12 made of metal foil, which was placed in the center of a cylindrical sleeve 13. Spaces above and below the capsule were occupied by thermal insulators 14. A metal foil heater 15 was placed between the sleeve 13 and a thermal insulator 16. This assembly was inserted into a cylindrical pressure chamber prepared at the centre of the main body 17a (FIG. 2D) of a pressure medium. The main body 17a was then sandwiched by a pair of pyramid-shaped pressure media 17b and 17c through metal foil electrodes 18a and 18b which are necessary for supplying power to the heater 15. FIG. 3 is simply a schematic illustration in which the dimensions of some part (e.g., foil etc.) are not exactly proportional to the actual sizes.

The assembled units of pressure media 17a, 17b and 17c including the sample chamber were placed in the eight second-stage anvils and compressed to a target pressure.

Then the starting material 11 was heated by applying electric current to the heater 15. The pressure applied to the starting material 11 was estimated from a load-pressure relationship acquired through a calibration experiment separately performed using the same high-pressure cell and standard material (ZnS, GaAs and GaP), each of which has a known (fixed) phase transition pressure at room temperature. The temperature was estimated from an applied electric power-temperature relationship through a temperature calibration experiment separately performed using a thermocouple. The estimated error of temperature is sufficiently low, below 5% even in a temperature range from 800 to 2000° C.

The pressure reaches to each target condition from the ambient pressure in about 180 min. At the target pressure, the sample was heated for 20 min. Subsequently, the high pressure cell was quenched to the ambient temperature by turning off the current to the heaters 15 so that the sample chamber was rapidly cooled by heat transfer to the surroundings. After quenching, the pressure was gradually released to the ambient pressure, and then the sample was collected.

Figure 4:
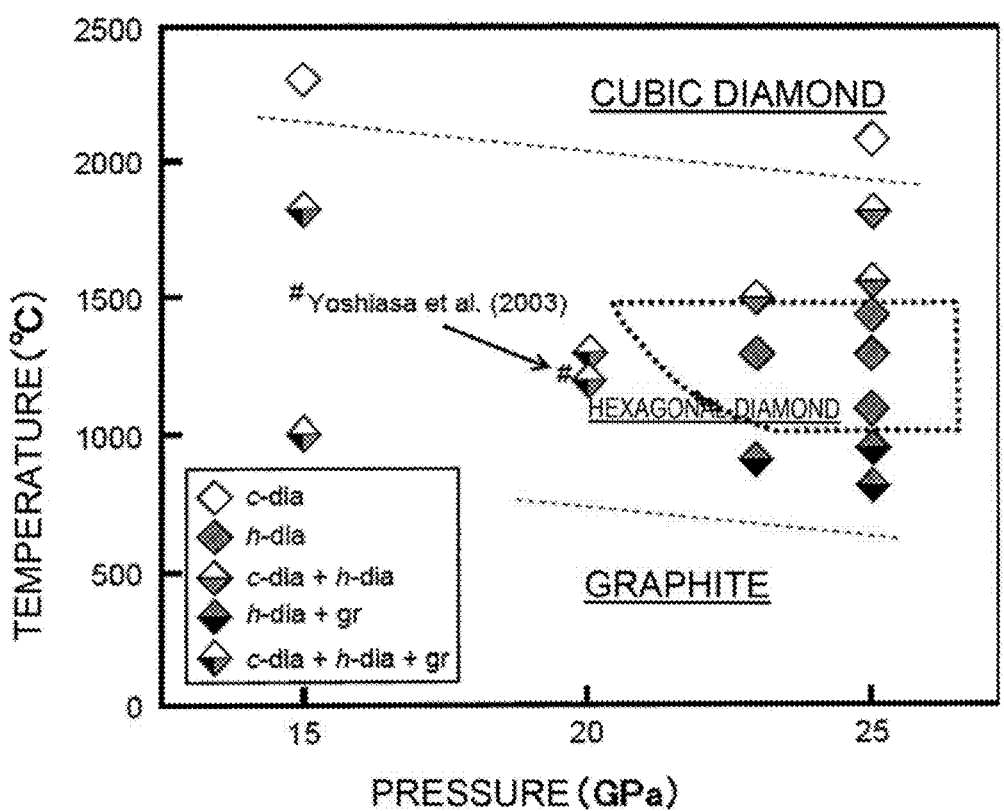
FIG. 4 is a pressure-temperature diagram showing experimental conditions required for the synthetic conditions of a pure hexagonal diamond compact.
Figure 5:
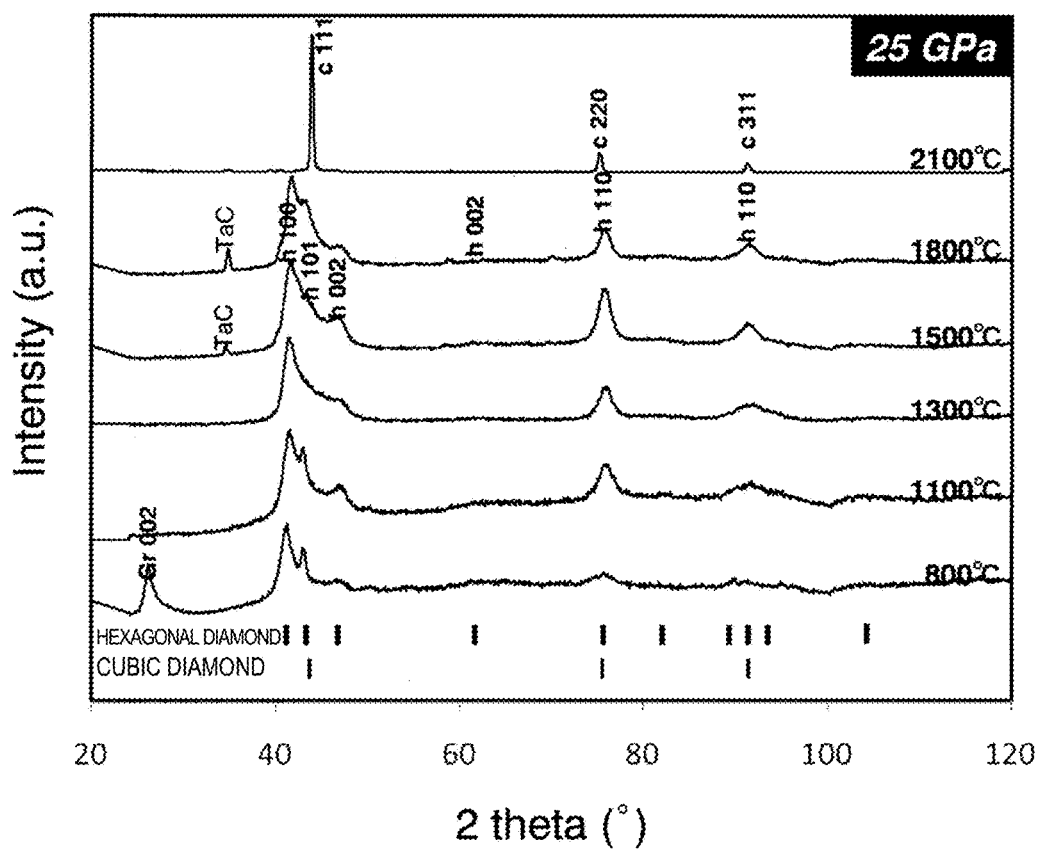
FIG. 5 shows X-ray diffraction patterns of samples manufactured at 25 GPa at various temperatures.

The phase(s) identified in the sample recovered from all the experiments is shown in FIG. 4. The crystal structure of the synthesized diamond was identified through X-ray diffraction and transmission electron microscope (TEM) observation. FIG. 5 shows a part of the variation of X-ray diffraction patterns obtained from some representative samples. The presence of a very small amount of coexisting phase other than hexagonal diamond (such as unreacted residue of graphite and cubic diamond), which cannot be detected by X-ray diffraction, was checked by microscopic Raman spectroscopy and electron diffraction.

As can be clearly seen in FIG. 4, pure hexagonal diamond compact were obtained at pressures of 23 and 25 GPa and temperatures ranging from 1000 to 1500° C. At higher temperatures than this range the formation of cubic diamond was observed, while at lower temperatures unreacted residual graphite was detected. On the other hand, the hexagonal diamond sample synthesized at 20 GPa was not pure and contained graphite and cubic diamond in a mixed manner.

In the next step, experiments were conducted by using highly oriented pyrolytic graphite (HOPG) with different mosaicity as starting materials under a condition of 25 GPa/1300° C./20 min. One HOPG is GRBS (ZYB) grade characterized by a mosaic spread of 0.8±0.2° and the other is GRHS (ZYH) grade with a mosaic spread of 3.5±1.5°, both of which are manufactured by NT-MDT. In the both cases, a pure (single-phase) hexagonal diamond compact was obtained.

Highly oriented and highly crystallized graphite made by other companies can also be used as the starting material as long as having equivalent mosaicity.

Figures 6A, 6B:
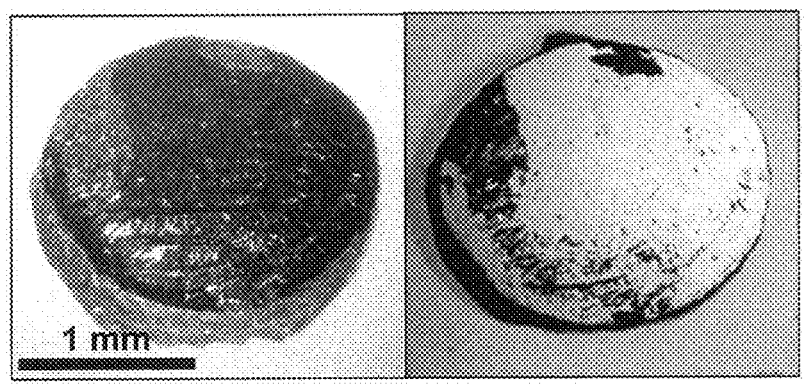
FIG. 6A shows a photograph of a pure hexagonal diamond compact fabricated in an embodiment.
FIG. 6B is a photograph of the same sample taken with reflected light.

(2) Embodiment of Characterizing the Pure Hexagonal Diamond Compact According to Present Invention Photographs of a pure hexagonal diamond compact made by the foregoing manufacturing method are shown in FIGS. 6A and 6B. FIG. 6A is a photograph taken with illumination given obliquely from a light source. FIG. 6B is a photograph taken with reflected light which was directed perpendicular to the top surface of the sample. These photographs were taken after to the top surface of the sample had been mechanically polished using diamond powder. The fact that a mirror surface was obtained after mechanical polishing suggests that the individual hexagonal diamond crystals in this sample are tightly sintered.

Figure 7A:
FIG. 7A shows a bright-field TEM image of a cross-section of a pure hexagonal diamond compact fabricated in the embodiment.
Figure 7B:
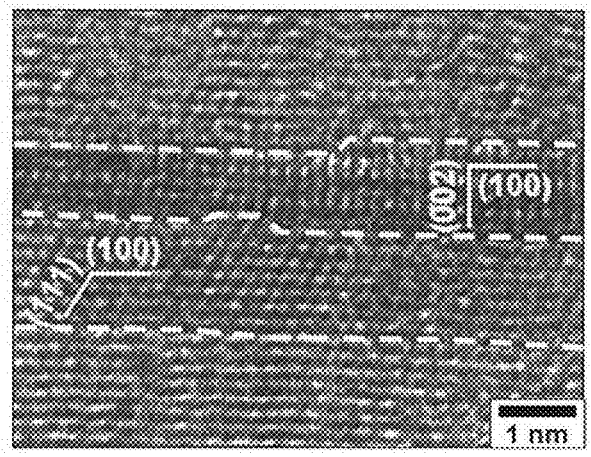
FIG. 7B is a high-resolution TEM image of individual layered crystals showing (100) crystal lattice fringes along the stacking direction.

FIG. 7A is a bright field TEM image of a cross-section cut out from the disk-shaped bulk sintered body. FIG. 7B is a high-resolution TEM image. These images suggest that the present product is indeed a bulk sintered body of hexagonal diamond with virtually no impurities and pores/voids.

Figure 8A:
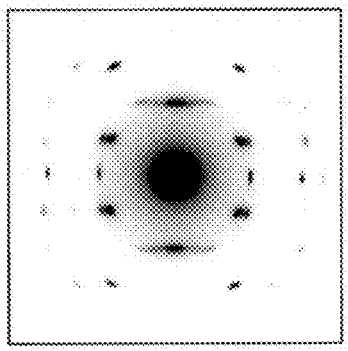
FIG. 8A shows a selected-area electron diffraction pattern obtained from the hexagonal diamond sample fabricated in the embodiment.
Figure 8B:
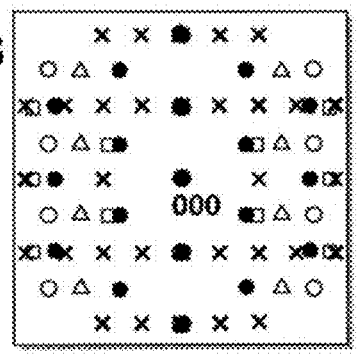
FIG. 8B is an interpretation of the observed diffraction pattern which consists of the superposition of the following five types of different reciprocal patterns.
Figure 8C:
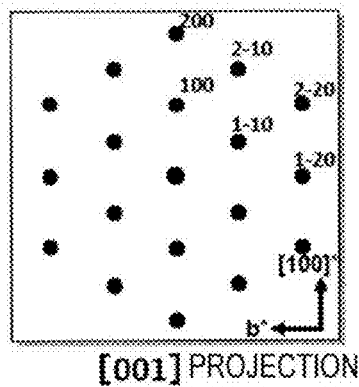
FIGS. 8C, 8D, 8E, 8F and 8G are five types of reciprocal Laue diagrams patterns projected respectively from of [001], [011], [021], [031] and [010] of hexagonal diamond projections that configure the diffraction diagram of FIG. 8B.
Figure 8D:
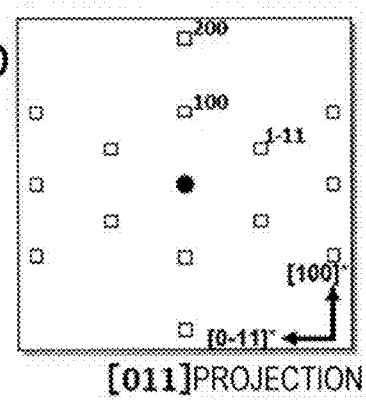
Figure 8E:
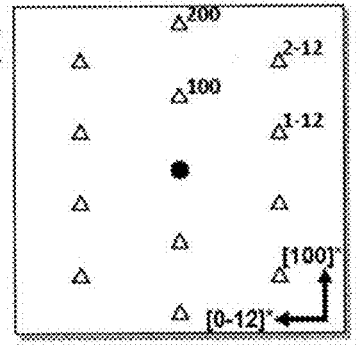
Figure 8F:
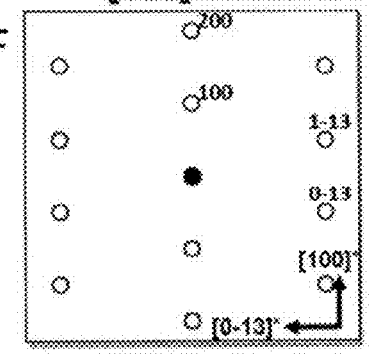
Figure 8G:
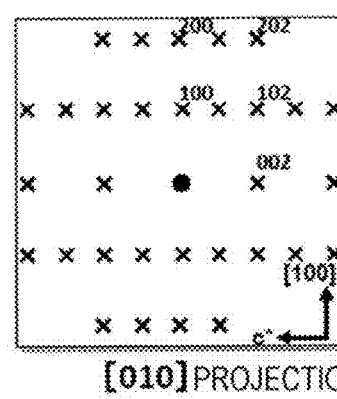

FIG. 8A is an electron diffraction pattern collected from a region with a diameter of 120 nm in the foregoing site in FIG. 7A. FIG. 8B is an interpreted Laue diffraction patterns which consists of the superposition of five types of single crystal Laue patterns shown in FIGS. 8C 8D, 8E, 8F and 8G in which [100]* of hexagonal diamond is exclusively oriented upward (stacking direction). Careful analysis of such electron diffraction patterns confirmed that the bulk sample fabricated in this embodiment indeed consists of pure (single-phase) hexagonal diamond.

FIG. 9 shows measured values of the lattice constant, volume and density of the hexagonal diamond fabricated by the present manufacturing method. These values are close to theoretical values.

REFERENCE SIGNS LIST

11 . . . Starting Material
12 . . . Capsule
13 . . . Sleeve
14 . . . Thermal Insulator
15 . . . Heater
16 . . . Thermal Insulator
17a to 17c . . . Pressure Media
18a and 18b . . . Electrodes

The invention claimed is:

1. A method of manufacturing a bulk sintered body of pure single-phase hexagonal diamond, wherein highly oriented and highly crystallized graphite having a mosaic spread of 5° or less kept at a temperature ranging from 1000 to 1500° C. and at a pressure of at least 21 GPa for a time period ranging from 1 to 60 min.

2. The method of manufacturing a bulk sintered body of pure single-phase hexagonal diamond according to claim 1, wherein the highly oriented and highly crystallized graphite has a mosaic spread of 1° or less.

3. The method of manufacturing a bulk sintered body of pure single-phase hexagonal diamond according to claim 2, wherein the pressure is at least 22 GPa, and the temperature ranges from 1200 to 1400° C.

4. The method of manufacturing a bulk sintered body of pure single-phase hexagonal diamond according to claim 3, wherein the time period ranges from 1 to 20 min.

5. The method of manufacturing a bulk sintered body of pure single-phase hexagonal diamond according to claim 2, wherein the time period ranges from 1 to 20 min.

6. The method of manufacturing a bulk sintered body of pure single-phase hexagonal diamond according to claim 1, wherein the pressure is at least 22 GPa, and the temperature ranges from 1200 to 1400° C.

7. The method of manufacturing a bulk sintered body of pure single-phase hexagonal diamond according to claim 6, wherein the time period ranges from 1 to 20 min.

8. The method of manufacturing a bulk sintered body of pure single-phase hexagonal diamond according to claim 1, wherein the time period ranges from 1 to 20 min.

* * * * *